United States Patent [19]

Pelgrom et al.

[11] Patent Number: 4,872,011
[45] Date of Patent: Oct. 3, 1989

[54] PLURAL STAGE SWITCHED CAPACITOR INTEGRATING DIGITAL-TO-ANALOG CONVERTER

[75] Inventors: Marcellinus J. M. Pelgrom; Adrianus C. J. Duinmaijer, both of Eindhoven, Netherlands

[73] Assignee: U.S. Philips Corporation, New York, N.Y.

[21] Appl. No.: 178,051

[22] Filed: Apr. 5, 1988

[30] Foreign Application Priority Data

Apr. 27, 1987 [NL] Netherlands .................. 8700983

[51] Int. Cl.⁴ .................. H03M 1/76; H03M 1/80
[52] U.S. Cl. .................. 341/150; 341/153; 341/154; 341/144; 341/126
[58] Field of Search ............ 341/144, 150, 153, 154, 341/128, 126

[56] References Cited

U.S. PATENT DOCUMENTS

| | | | |
|---|---|---|---|
| 4,077,035 | 2/1978 | Yee | 341/153 |
| 4,213,120 | 7/1980 | Buchanan | 341/150 |
| 4,468,654 | 8/1984 | Kapral | 341/150 |
| 4,584,568 | 4/1986 | Zomorrodi | 341/150 |
| 4,611,195 | 9/1986 | Shosaku | 341/150 |
| 4,661,802 | 4/1987 | Yukawa | 341/150 |
| 4,665,380 | 5/1987 | Lewyn | 341/150 |
| 4,667,179 | 5/1987 | Law et al. | 341/150 |
| 4,799,042 | 1/1989 | Confalonieri | 341/150 |

Primary Examiner—A. D. Pellinen
Assistant Examiner—H. L. Williams
Attorney, Agent, or Firm—Bernard Franzblau

[57] ABSTRACT

A digital-to-analog converter for converting a digital signal having a word length n into an analog signal. The converter includes at least two switched capacitor integrators (1, 2) arranged in series and a control unit (18) for applying control signals to the integrators which perform an integration step under the influence of the control signal. Each integrator is provided with a capacitor network (11, 12) having at least two capacitors (27.1, 27.2, ...; 28.1, 28.2, ...) coupled between the input (13; 4) of the integrator and the inverting input (−) of an associated amplifier stage (5; 6). A capacitor (9; 10) is coupled between the inverting input (−) and the output (7; 8) of this amplifier stage. The control unit is adapted to apply, in this order, a first control signal to the first integrator (1), a second control signal to the second integrator (2), a third control signal to the first integrator and a fourth control signal to the second integrator. The first integrator couples a total capacitance of M1.Cref1 and M3.Cref1 during a given time interval to the inverting input of the amplifier stage (5) under the influence of the first and the third control signal, respectively. The second integrator (2) couples a total capacitance of M2.Cref2 and M4.Cref2 during a given time interval to the inverting output of the amplifier stage (6) under the influence of the second and the fourth control signal, respectively. For converting an arbitrary n-bit digital signal, M2+M4 is equal to a constant (k) which is preferably equal to $2^p$ in which $p \leq n$ an offset voltage which is independent of the value of the digital signal to be converted is produced at the output (8) of the converter.

20 Claims, 6 Drawing Sheets

PLURAL STAGE SWITCHED CAPACITOR INTEGRATING DIGITAL-TO-ANALOG CONVERTER

BACKGROUND OF THE INVENTION

The invention relates to a digital-to-analog converter for converting a digital signal having a word length n into an analog signal, comprising a series arrangement of a first and a second integrating circuit each having an input and output and a control signal input, the output of the first integrating circuit coupled to the input of the second integrating circuit, each of the the first and second integrating circuits comprising a first and a second amplifier stage, respectively, each having an inverting and non-inverting input and an output and a first and second capacitors, respectively, coupled between the inverting input and the output of the first and second amplifier stages, respectively, the first and the second integrating circuit being adapted to perform an integration step under the influence of a control signal applied to the control signal input, a control unit having a first and a second output coupled to the control signal input of the first and the second integrating circuit, respectively, said control unit being adapted to supply, in this order, a first control signal at its first output, a second control signal at its second output, a third control signal at its first output and a fourth control signal at its second output.

A converter of this type is known from the published Japanese Patent Application (kokai) No. 59-8427 and is intended to convert an n-bit digital signal. The integrating circuits in the known converter are in the form of analog integrators.

The known converter is intended to convert 16-bit digital signals into analog signals and it operates as follows. Under the influence of the first control signal the first integrating circuit performs, M1 times an integration step so that a first value is derived which is proportional to $2^8 V_{ref}$, in which Vref is a reference value. Subsequently the second integrating circuit is activated M2 times by the second control signal so that an analog signal, which is proportional to $MSB.2^8 V_{ref}$, is produced at the output of the second circuit, in which MSB is equal to the value of the binary number of the eight most significant bits of the 16-bit digital signal. Subsequently the output of the first integrating circuit is brought to an initial level (reset to zero in this case) under the influence of a reset signal of the control unit. Subsequently the first circuit performs M3 integration steps under the influence of the third control signal so that a value proportional to Vref is derived. The second circuit is then activated M4 times by the fourth control signal. An analog output signal is now produced which is proportional to $(MSB.2^8 + LSB)V_{ref}$ in which LSB is equal to the value of the binary number of the eight least significant bits of the 16-bit digital signal. The known converter appears to have a disturbing offset component in the analog output signal.

SUMMARY OF THE INVENTION

It is an object of the invention to provide a digital-to-analog converter which does not have (substantially) any disturbing offset component in the analog output signal. The digital-to-analog converter according to the invention is therefore characterized in that the integrators are switched capacitor integrators and in that a first capacitor network comprising at least two capacitors is coupled between the input of the first integrator and the inverting input of the first amplifier stage, a second capacitor network comprising at least two capacitors being coupled between the input of the second integrator and the inverting input of the second amplifier stage, the first capacitor network being adapted to couple during a given time interval a total capacitance of $M1.C_{ref1}$ and $M3.C_{ref1}$ to the inverting input of the first amplifier stage under the influence of the first and the third control signal, respectively, the second capacitor network being adapted to couple during a given time interval a total capacitance of $M2.C_{ref2}$ and $M4.C_{ref2}$ to the inverting input of the second amplifier stage under the influence of the second and the fourth control signal, respectively, $C_{ref1}$ and $C_{ref2}$ being fixed capacitances, and in that for converting arbitrary digital signals having a word length n $M2+M4$ is equal to a constant (k). For converting an n-bit digital signal the constant (k) is preferably chosen to be equal to $2^p$ in which $p \leq n$.

Thus, the invention is not limited to use in digital-to-analog converters for converting binary (digital) signals having a word length n. The invention can also be used in digital-to-analog converters for converting digital signals having a word length n which may be associated with numerical systems other than the binary system. For example, ternary or quaternary numerical systems are feasible.

The invention is based on the following recognition. The known converter appears to generate an offset at its ouptput which is signal-dependent. This means that the offset for different values of the n-bit digital signal has a different magnitude. It can be calculated that the offset at the output of the converter, in so far as it results from an offset $V_o$ at the output of the first integrating circuit, is equal to $$(MSB + LSB).V_o$$

This means, for example, for a 16-bit digital signal for which it holds that MSB=0 and LSB=255 (decimal), that the offset is equal to 255 $V_o$. However, for the 16-bit digital signal which is larger by the value of 1, i.e. MSB=1 and LSB=0, this means that the offset is equal to $V_o$.

The measure according to the invention is based on the recognition that the two integrating circuits can be controlled in such a way that a signal-independent offset is generated at the output of the converter. This means that an offset voltage is produced at the output of the converter but the magnitude of this offset voltage is independent of the value of the digital signal. For this fixed offset voltage, whose magnitude can of course be determined in a simple manner, a compensation, if required, can be easily realized at a later stage. Since the second integrating circuit according to the invention initially receives the second and then the fourth control signal, while firstly a total capacitance of $M2.C_{ref2}$ and then a total capacitance of $M4.C_{ref2}$ is coupled to the inverting input of the second amplifier stage, and in which $M2+M4$ is equal to a constant k, an offset voltage which is proportional to $(M2+M4).V_o$, i.e. equal to $k.V_o$ is generated at the output of the converter. The offset voltage thus has a given constant value, irrespective of the signal to be converted.

The digital-to-analog converter may be further characterized in that M3=1, in that M4 is the value corresponding to the binary number formed by the p least significant bits of the n-bit digital signal and in that M1 is the value corresponding to the binary number formed by the n−p most significant bits of the n-bit digital signal. In contrast to the control in the known converter in which the first integrating circuit generates a fixed value (namely the aforementioned first and second value) and in which only the second integrating circuit is controlled by control signals derived from the value of the n-bit digital signal, signals which are dependent on the value of the digital signal to be converted in all four integration steps are derived in both the first and the second integrating circuit in the converter according to the invention. Thus, it holds for the first integration step that M1 is equal to the previously mentioned value MSB, M2=k−M4 for the second integration step, M3=1 for the third integration step (which means that after two integration steps in the first integrator an output signal is present at its output which is equal to (M1+1).Vref, i.e. (MSB+1).Vref, which signal is thus also dependent on the value of the n-bit digital signal), and M4 is equal to the previously mentioned value LSB for the fourth integration step.

The digital-to-analog converter may be further characterized in that a third switched capacitor integrator comprising a third amplifier stage, a third capacitor coupled between an inverting input and an output of this amplifier stage and a third capacitor network comprising at least two capacitors coupled to an input of the third integrator and to the inverting input of the amplifier stage. The third integrator is arranged in series with the second switched capacitor integrator, and is adapted to perform an integration step under the influence of a control signal at a control signal input of third integrator. The control unit is adaped to generate a reset signal for bringing the signal at the output of the first integrator to an initial level and for subsequently generating a fifth control signal to be applied to a first output, the control unit being further adapted to generate, in this order, a sixth control signal and an eighth control signal to be applied to a third output which is coupled to the control signal input of the third integrator and being adapted to generate, after the sixth control signal and before the eighth control signal, a seventh control signal to be applied to the second output. The first capacitor network is further adapted to couple during a given time interval a total capacitance of M5.Cref1 to the inverting input of the first amplifier stage under the influence of the fifth control signal, the third capacitor network being adapted to couple during a given time interval a total capacitance of M6.Cref3 and M8.Cref3 to the inverting input of the third amplifier stage under the influence of the sixth and the eighth control signal, respectively, the second capacitor network being adapted to couple during a given time interval a total capacitance of M7.Cref2 to the inverting input of the second amplifier stage under the influence of the seventh control signal, Cref3 being a fixed capacitance. If for converting arbitrary n-bit digital signals it holds that M6+M8 is equal to a constant (k'), for example equal to $2^q$ in which $p+q \leq n$, an offset is produced at the output of the converter, which offset is also more or less constant and more or less independent of the value of the digital signal.

It is of course evident that the converter according to the invention may be further extended by arranging at least a fourth integrator in series with the third integrator.

For converting an n-bit digital signal the digital-to-analog converter may be further characterized in that M3=M5=M7=1, in that M8 is the value corresponding to the binary number constituted by the q least significant bits of the n-bit digital signal, M1 is the value corresponding to the binary number constituted by the n−p−q most significant bits and M4 is the value corresponding to the binary number constituted by the remaining p bits of the n-bit digital signal. The n-bit digital signal to be converted has now been split up into three parts, namely the n−p−q most significant bits constituting the (decimal) number M1 or MSB, the q least significant bits constituting the (decimal) number M8 or LSB and the remaining p bits constituting the (decimal) number M4 or ISB. The first four integration steps in the first and the second integrator are equal to those in the previously described embodiment, with the difference that M1 now corresponds to the n−p−q most significant bits and M2=k−ISB and M4=ISB. It may be clear that the sixth integration step, which is performed by the third integrator, can be performed at any moment after the fourth integration step, which is performed by the second integrator. It is clear that in the sixth and the eighth integration step performed by the third integrator a total capacitance of k'.Cref3 is coupled to the inverting input of the third amplifier stage, which capacitance is constant for an arbitrary digital signal.

In the two-stage design of the converter p is preferably equal to n/2 if n is even. In the three-stage version it preferably holds that p=q=n/3 if n is divisible by 3. In these cases the total capacitance in the capacitor networks is lowest so that the required surface area in the IC for the capacitors is also smallest.

To be able to reset to an initial output level, a parallel arrangement of a switching element and first capacitor may be coupled between the inverting input and the output of the first integrating circuit. The switching element has a control signal input for receiving the reset signal.

The capacitor networks may be constructed in different ways. One possibility is to provide a capacitor network with capacitors having a substantially equal capacitance. Another possibility is for successive capacitors in a capacitor network to have a capacitance which is each time a factor of 2 larger. The first-mentioned possibility is more advantageous because the spread in the capacitors may be lower in this case.

The influence of the spread on the output signal of the converter may be further suppressed by constituting the total capacitances M2.Cref2 and M4.Cref2 by parts in the second capacitor network which are complementary with respect to one another. The same applies to the realization of the capacitances M6.Cref3 and M8.Cref8 in the third capacitor network.

BRIEF DESCRIPTION OF THE DRAWINGS

The invention will now be described in greater detail, by way of example, with reference to the accompanying drawings in which.

DESCRIPTION OF THE PREFERRED EMBODIMENTS

Figure 1:
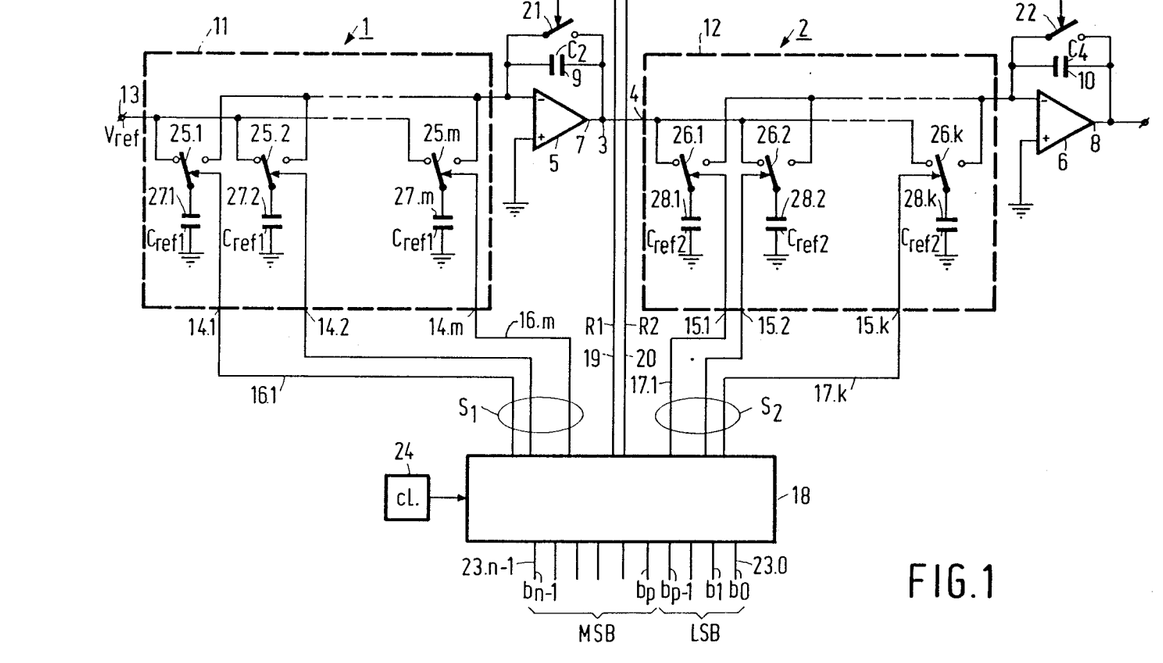
FIG. 1 shows a first embodiment of the converter comprising two integrators.
Figure 2:
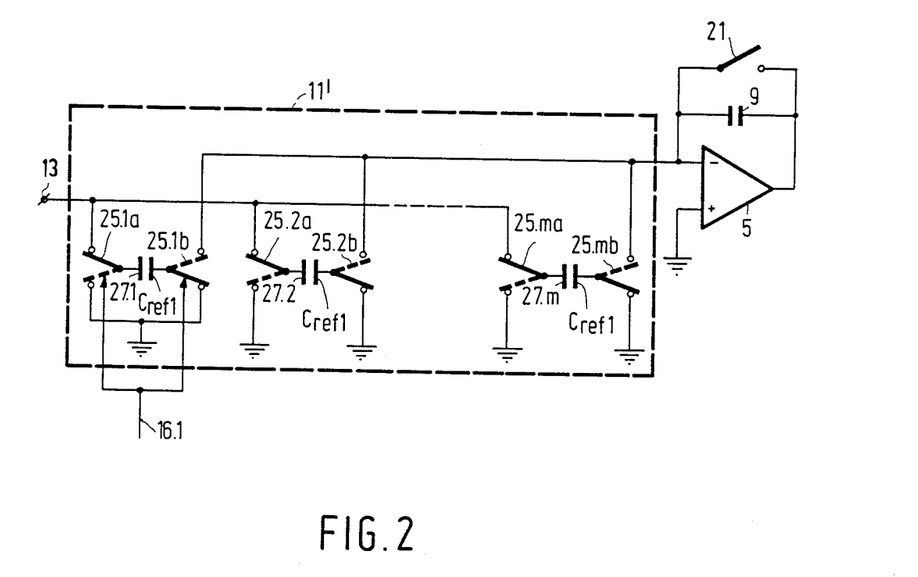
FIG. 2 shows a part of the embodiment of FIG. 1, but comprising a different capacitor network.

FIG. 1 shows a digital-to-analog converter comprising a series arrangement of a first and a second switched capacitor integrator 1 and 2, respectively. An output 3 of the first integrator 1 is coupled to an input 4 of the second integrator 2. The integrators comprise amplifier stages 5 and 6 having inverting (−) and non-inverting (+) inputs and outputs 7 and 8, capacitors 9 and 10, respectively, coupled between the inverting input and the output and capacitor networks 11 and 12 comprising at least two capacitors and being coupled between the inputs 13 and 4, respectively, of the integrators and the inverting input of the amplifier stages. The non-inverting inputs (+) of the amplifier stages 5 and 6 are coupled to a point of constant potential (ground). Control signal inputs 14 and 15 of the first and the second integrator 1 and 2 are intended to receive control signals which are applied via the leads 16.1 to 16.m and 17.1 to 17.k, respectively, from a control unit 18. The control signal for the first integrator 1 is applied via the inputs 14.1 to 14.m of the capacitor network 11 to switches 25.1 to 25.m for controlling these switches. The control signal for the second integrator 2 is appled via the inputs 15.1 to 15.k of the capacitor network 12 to switches 26.1 to 26.k for controlling these switches. The capacitor network 11 comprises m capacitors 27.1 to 27.m all having a capacitance Cref1. In the one position of the switches 25.1 to 25.m the capacitors 27.1 to 27.m are coupled between the input terminal 13 and ground and in the other position of these switches the capacitors are coupled between the inverting input of the amplifier stage 5 and ground. The same applies to the switches 26.1 to 26.k in the capacitor network 12. All capacitors 26.1 to 26.k have a capacitance Cref2. The capacitor network 11 and 12 are rather sensitive to parasitic capacitances, see the description with reference to FIG. 14 in Philips Technisch Tijdschrift 41, No. 4, pages 109–129. In practice a different configuration of the switches and the capacitors will therefore preferably be taken, for example, using the circuits as described with reference to FIG. 13 in the said Journal. Their realization, using the circuit described with reference to FIG. 13a of this Journal, is shown in FIG. 2 for the capacitor network 11. For the explanation of the operation of the embodiment of FIG. 1 the less ideal network may suffice, which is also described in the aforementioned Journal, see FIG. 11b.

First and second reset signals R1 and R2 are applied via the leads 19 and 20 from the control unit 18 to switching elements 21 and 22 arranged parallel to the capacitors 9 and 10. The control unit 18 derives the control signals from the n-bit digital signal which is applied via the inputs 23.0 to 23.n−1 to the control unit 1. The control unit also receives clock pulses from a clock generator 24.

The converter of FIG. 1 operates as follows. In the shown position of the switches 25.1 to 25.m the capacitors 27.1 to 27.m are charged to the voltage Vref. This position of the switches is realized because, for example, a logic low signal is applied to these switches via all leads 16.1 to 16.m A reset signal R1 is applied via the lead 19 to the switch 21. The capacitor 9 is thereby discharged. Under the influence of a reset signal R2 the capacitor 10 is also discharged. The reset signal R2 may be generated at a different instant, provided that this instant is before the moment when the integrator 2 performs an integration step for the first time. A first control signal is applied via the leads 16.1 to 16.m to the integrator 1. This means that at M1 of the m leads the signal becomes "high" for a short period. As a result M1 of the m switches change over for a short period to the position different from the one shown. M1 of the m capacitors 25 are discharged, and the capacitor 9 is charged thereby. A voltage which is equal to $$M1.Vref.Cref1/C2 = M1.\alpha.Vref$$

is produced at the output 7, in which C2 is the capacitance of the capacitor 9.

In the position shown of the switches 26.1 to 26.k the capacitors 28.1 to 28.k are charged to the above-mentioned voltage. The position of the switch 26 is determined by, for example, a logic low signal which is applied to these switches via the leads 17.1 to 17.k. Subsequently a second control signal is applied to the integrator 2 via the leads 17.1 to 17.k. This means that at M2 (=k−M4) of the k leads 17 a "high" signal is applied for a short period to M2 of the k switches 26 which thereby assumes for a short period the position different from the one shown. M2 capacitors 28 are thus discharged and the capacitor 10 is charged. A voltage which is equal to $$M1.(k-M4).\alpha.\beta.Vref$$

is then produced at the output 8, in which $\beta$ is equal to Cref2/C4 and C4 is the capacitance of the capacitor 10. Subsequently a third control signal is applied via the leads 16 to the integrator 1. This means that the signal becomes "high" for a short period at M3 (=1) of the m leads 16. A voltage which is equal to $$(M1+1).\alpha.Vref.$$

is then produced at the output 7. Finally the fourth control signal is applied to the integrator 2 via the leads 17. This means that the signal becomes "high" for a short period at M4 of the k leads 17. Preferably they are those M4 of the k leads which remained "low" during the second integration step. The remaining M4 capacitors in the capacitor network 12 are now coupled to the inverting input of the amplifier stage 6. The advantage of this measure is that the spread in the capacitances of the capacitors 26 has a minimum influence on the output signal 7. A voltage which is equal to $M4.(M1+1).\alpha.\beta.Vref + M1.(k-M4).\alpha.\beta.Vref.$ is then produced at the output 8 of the second integrator 2.

This is equal to $$(M1.k+M4).\alpha.\beta.Vref, \text{ or for } k=2^p$$

$$(M1.2^p+M4).\alpha.\beta.Vref, \text{ where } p \leq n.$$

For $k=2^p$ it then holds that m in FIG. 1 is equal to $2^{n-p}$. For converting the n-bit digital signal $b_{n-1} \ldots b_0$, see FIG. 1, which is applied to the input 23 of the control unit 18, the (decimal) number LSB is to be taken for M4, corresponding to the binary number $b_{p-1} \ldots b_1 b_0$, that is to say, the binary number constituted by the p least significant bits of the digital signal. For M1 the (decimal) number MSB is to be taken which corresponds to the binary number $b_{n-1} \ldots b_p$, that is to say, the binary number constituted by the n−p most significant bits of the digital signal.

It is clear that in the second and the fourth integration step combined a fixed capacitance of $(M2+M4)\cdot Cref2$ is coupled to the inverting input of the amplifier stage 6 for any arbitrary n-bit digital signal which is converted by the converter. This means that the offset at the output 8 due to the offset $V_o$ at the output 7 has the same fixed value in all cases. This can be shown by means of the following calculation.

After the first integration step the output 7 conveys a voltage $$M1.\alpha.Vref+V_o.$$

After the second integration step the output 8 conveys a voltage $$(M1.\alpha.Vref+V_o).(k-M4).\beta.$$

After the third integration step the output 7 conveys a voltage $$(M1+1).\alpha.Vref+V_o.$$

After the fourth integration step this leads to a voltage at the output 8 which is equal to $$(M1.k+M4).\alpha.\beta.Vref+k.\beta.V_o.$$

Since k is constant for an arbitrary n-bit digital signal, the offset voltage at the output 8 is also constant for an arbitrary digital signal to be converted.

For k is even it will be preferred to take $p=n/2$. This has the advantage that the total number of capacitors in the capacitor networks 11 and 12 is then smallest, namely equal to $2.2^p$ and that consequently the required IC surface is smallest. One requirement for the capacitors 27 and also for the capacitors 28 is that they should have a capacitance which is identical as much as possible. The conversion by means of a converter of the type as shown in FIG. 1 then yields a reasonably accurate and fast digital-to-analog conversion. In fact, only five clock pulses of the clock pulse generator 24 are required for one conversion, namely a first clock pulse for generating the reset signals and then four clock pulses for generating the four control signals.

The converter of FIG. 1, comprising capacitor networks like the network 11′ of FIG. 2 operates in the same manner as described above. In the case of a logic low signal on the lead 16.1 the switches 25.1a and 25.1b are in the position shown. The capacitor 27.1 is then charged to the voltage Vref. If the signal on the lead 16.1 becomes "high", the two switches 25.1a and 25.1b change over to the position other than the one shown. The capacitor 27.1 now discharges via the inverting input of the amplifier stage 5 so that the capacitor 9 is charged. The switches 25.2a and 25.2b to 25.ma and 25.mb operate in the same way.

Figure 3:
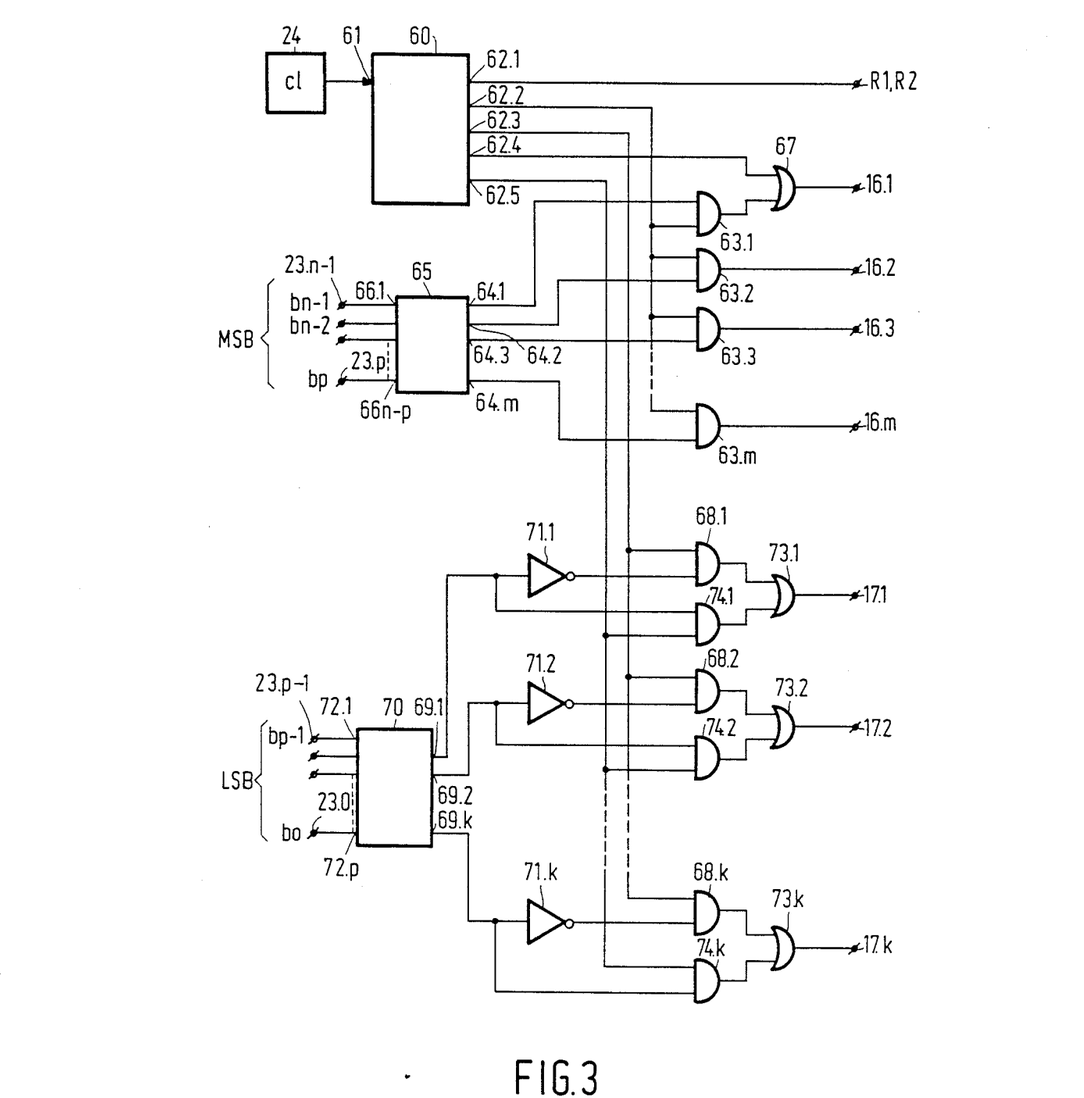
FIG. 3 shows an embodiment of the control unit in the converter of FIG. 1.

FIG. 3 shows a possible embodiment of the control unit 18 in the converter of FIG. 1. The control unit comprises a 5-counter 60. Under the influence of the clock pulses cl of the clock generator 24, applied to the input 61 of the counter 60, a subsequent output 62.i of the five outputs 62.1 to 62.5 each time becomes "high", starting with the output 62.1. This output supplies the reset pulses R1 and R2. At the next clock pulse the output 62.2 becomes "high". This output is coupled to an input of AND-gates 63.1 to 63.m. Another input of these AND-gates 63 is coupled to an associated output of the m outputs 64.1 to 64.m of a circuit 65. This circuit has n−p inputs 66 to which the digital number MSB is applied, i.e. the digital number $b_{n-1} \ldots b_p$ constituted by the n−p most significant bits of the n-bit digital signal to be converted. The circuit 65 renders as many outputs 64 "high", namely a total of M1 outputs, as is consistent with the (decimal) number corresponding to the afore mentioned n−p-bit digital number. Thus this means that $m=2^{n-p}$. Since the output 62.2 is "high", the AND-gates 63 are enabled and the signals at the outputs 64 of the circuit 65 are passed. The signal at the output 64.1 is then applied via the AND-gate 63.1 and an OR-gate 67 to the lead 16.1. Similarly, the signals at the outputs 64.i, in which i extends from 2 to $2^{n-p}$, are applied via the AND-gates 63.i to the lead 16.i. This realizes the first integration step in the converter of FIG. 1. At the next clock pulse of the generator 24 the output 62.2 becomes low again, the AND-gates 63 are inhibited and the output 62.3 becomes "high". This output is coupled to an input of AND-gates 68.1 to 68.k so that these gates are enabled. Outputs 69.1 to 69.k of a circuit 70 are coupled via inverters 71.1 to 71.k to the other input of the AND-gates 68.1 to 68.k, respectively. The circuit 70 has p inputs 72.1 to 72.p to which the digital number $b_{p-1} \ldots b_0$ corresponding to the p least significant bits of the n-bit digital signal to be converted is applied. The circuit operates in the same way as the circuit 65. This means that M4 of the k $(=2^p)$ outputs 69 become "high". The signals at the outputs 69.i, in which i extends from 1 to k, are now applied via the inverters 71.i, the AND-gates 68.i and the OR-gates 73.i to the leads 17.i. Due to the signal inversion in the inverters 71 this means that k−M4 of the k leads 17 convey a "high" signal. This leads to the second integration step in the converter of FIG. 1. At the next clock pulse the output 62.3 becomes "low" again, the AND-gates 68 are inhibited and the output 62.4 becomes "high". This output is coupled to the second input of the OR-gate 67 which thus leads to a "high" signal on the lead 16.1: the third integration step in the converter. At the subsequent clock pulse the output 62.4 becomes "low" again and the output 62.5 becomes "high". The output 62.5 is coupled to an input of k AND-gates 74.1 to 74.k. The other inputs of these AND-gates 74.i are coupled to corresponding outputs 69.i of the circuit 70 (i extends from 1 to k). The outputs of the AND-gate 74.i are each coupled to a second input of the associated OR-gate 73.i. The "high" signal at the output 62.5 enables the AND-gates 74 so that the signals present at the outputs 69 can be applied to the leads 17. This means that a "high" signal appears on M4 of the k leads 17. Consequently the complementary part of the capacitors in the network 12 is coupled to the inverting input of the amplifier stage 6. This leads to the fourth integration step in the converter of FIG. 1, whereafter the conversion of the n-bit digital signal is completed. At the next clock pulse of the generator 24 a new n-bit digital signal is applied to the inputs 66 and 72 of the circuits 65 and 70 and the output 62.5 becomes "low" again and the output 62.1 becomes "high". The conversion of a subsequent n-bit digital signal begins.

Figure 4:
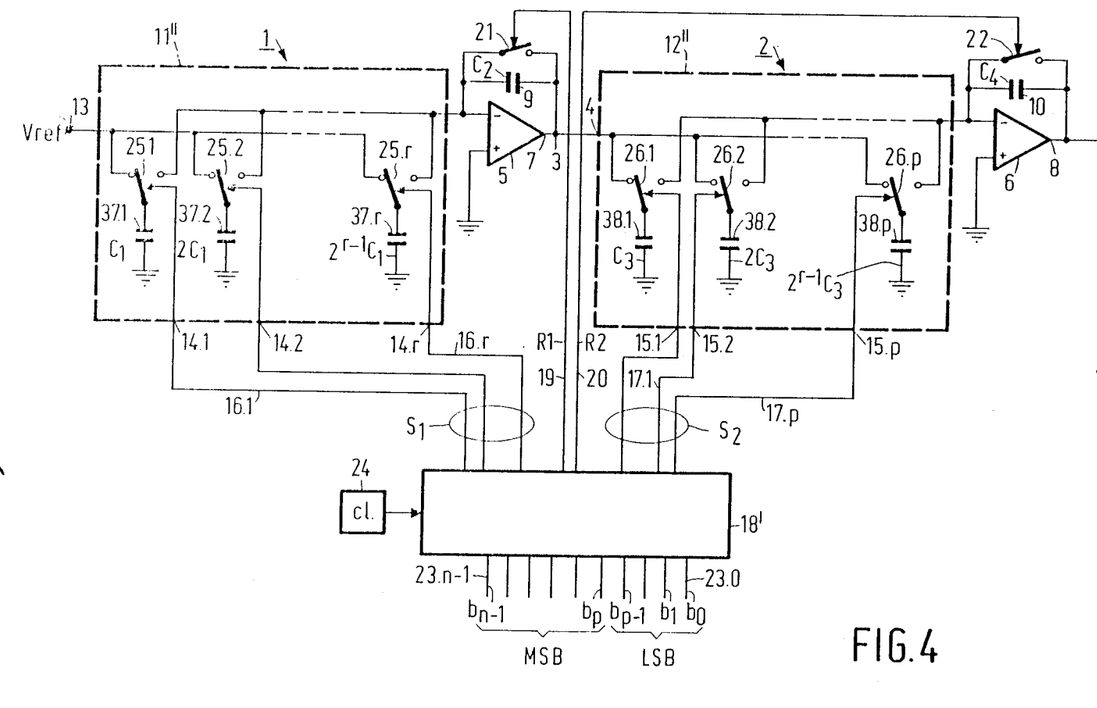
FIG. 4 shows a second embodiment of a converter comprising two integrators.

FIG. 4 shows a second embodiment of a two-stage digital-to-analog converter which, however, bears a great resemblance to the converter of FIG. 1. Only the capacitor networks and the control unit are formed differently. They are now denoted by the reference numerals 11", 12" and 18', respectively. The capacitor network 11' comprises r capacitors 37.1 to 37.r. As will be evident hereinafter, r=n−p. The capacitor network 12" comprises p capacitors 38.1 to 38.p. The capacitance of one of the capacitors 37.1 to 37.r is always a factor of 2 larger than that of the capacitor having a previous ordinal number. Thus this means that the capacitors 37.1 to 37.r have a capacitance which is equal to C1, 2C1, ..., $2^{n-p}$.C1. Similarly the capacitors 38.1 to 38.p have capacitances which are equal to C3, 2C3, ..., $2^p$.C3, respectively. Preferably, the capacitors 37.2 to 37.r and 38.2 to 38.p are formed by means of a parallel circuit of one or more of the unit capacitors C1 and C3, respectively. This has for its object to achieve an optimum ratio between the capacitances. The control unit 18' operates differently because the control of the capacitor networks must now be different. The converter operates as follows.

The leads 16.1 to 16.r convey a logic low signal so that all switches 25.1 to 25.r are in the positon shown. The capacitors 37.1 to 37.r are then charged to the voltage Vref. The control unit 18' first applies reset signals R1 and R2 via the leads 19 and 20 to the switches 21 and 22 so that the capacitors 9 and 10 are discharged. Subsequently the signal on a number of the leads 16.1 to 16.r becomes "high" and thus a number of the switches 25.1 to 25.r are changed over for a short period in such a way that a total capacitance of M1.C1 is coupled to the inverting input of the amplifier stage 5. In fact this means that the signal on the lead 16.1 corresponds to the bit $b_p$ of the n-bit digital signal, the signal on the lead 16.2 corresponds to the bit $b_{p+1}$, ... etc. ... and the signal on the lead 16.r corresponds to the bit $b_{n-1}$ of the n-bit digital signal. Subsequently the signal on a number of the leads 17.1 to 17.p becomes "high" and consequently a number of the switches 26.1 to 26.p are switched over for a short period to the position other than the one shown so that a total capacitance of ($2^p$−M4).C3 is coupled to the inverting input of the amplifier stage 6. In fact, this means that, if a bit $b_i$ of the p-bit digital signal $b_{p-1}$... $b_0$ applied to the inputs 23.0 to 23.p−1 of the control unit 18' has a logic value "0", the signal on the associated lead 17.i becomes "high" (i extending from 0 to p−1). Subsequently the signal on the lead 16.1 becomes "high" for a short period so that the switch 37.1 changes over for a short period. Then the signal becomes "high" for a short period on a number of the leads 17.1 to 17.p, and this in such a way that a total capacitance of M4.C3 is coupled to the inverting input of the amplifier stage 6. In fact this means that if a bit $b_i$ of the afore-mentioned p-bit digital number is a logic "1", the signal on the associated lead 17.i, i.e. the lead having the same index i as the bit $b_i$, is "high" (with i extending again from 0 to p−1).

Figure 5:
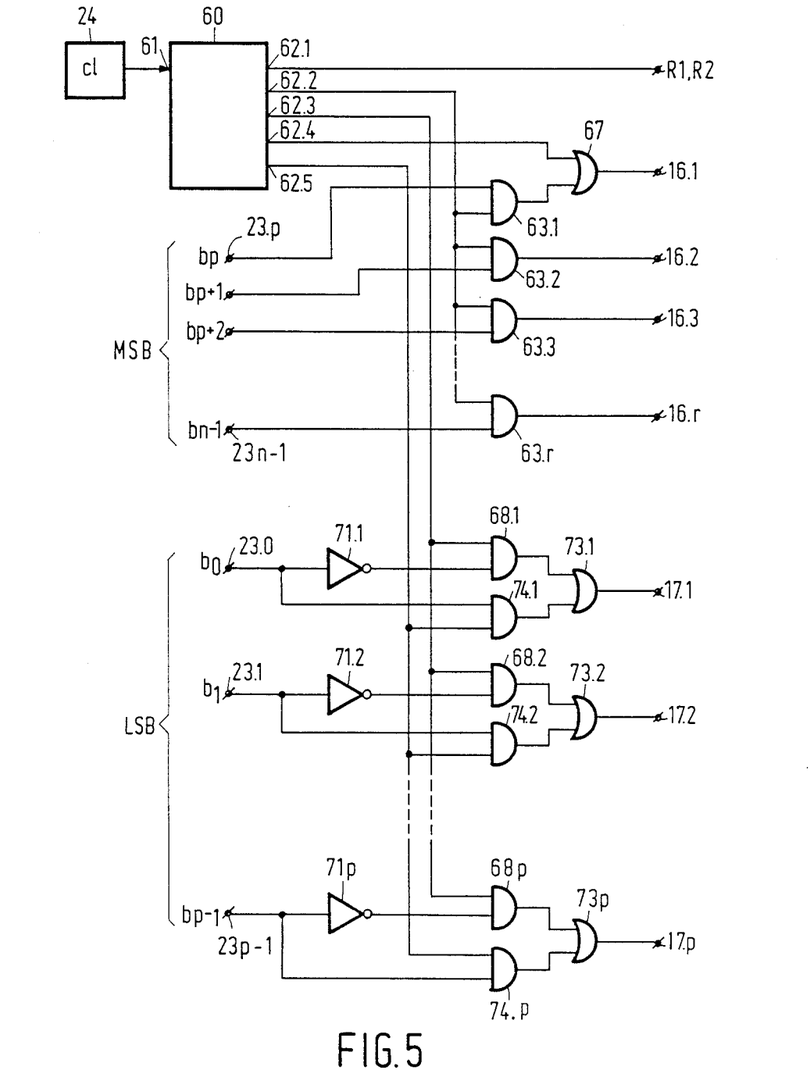
FIG. 5 shows an embodiment of the control unit in the converter of FIG. 4.

FIG. 5 shows an embodiment of the control unit 18' in the converter of FIG. 4. The circuit diagram of the control unit of FIG. 5 shows a great resemblance to the control unit of FIG. 3. The only difference with the control unit of FIG. 3. is that the circuits 65 and 70 of that control unit are absent in the control unit of FIG. 5 and that there are only r (=n−p) AND-gates 63, p AND-gates 68, p AND-gates 74, p OR-gates 73 and p inverters 71. This means that the inputs 23.0 to 23.p−1 are now directly coupled to the inverters 71.1 to 71.p and the AND-gates 68.1 to 68.p and that the inputs 23.p to 23.n−1 are now directly coupled to the AND-gates 63.1 to 63.r. Otherwise, the operation of this control unit is identical to that of the control unit of FIG. 3 so that it does not require any further explanation.

Figure 6:
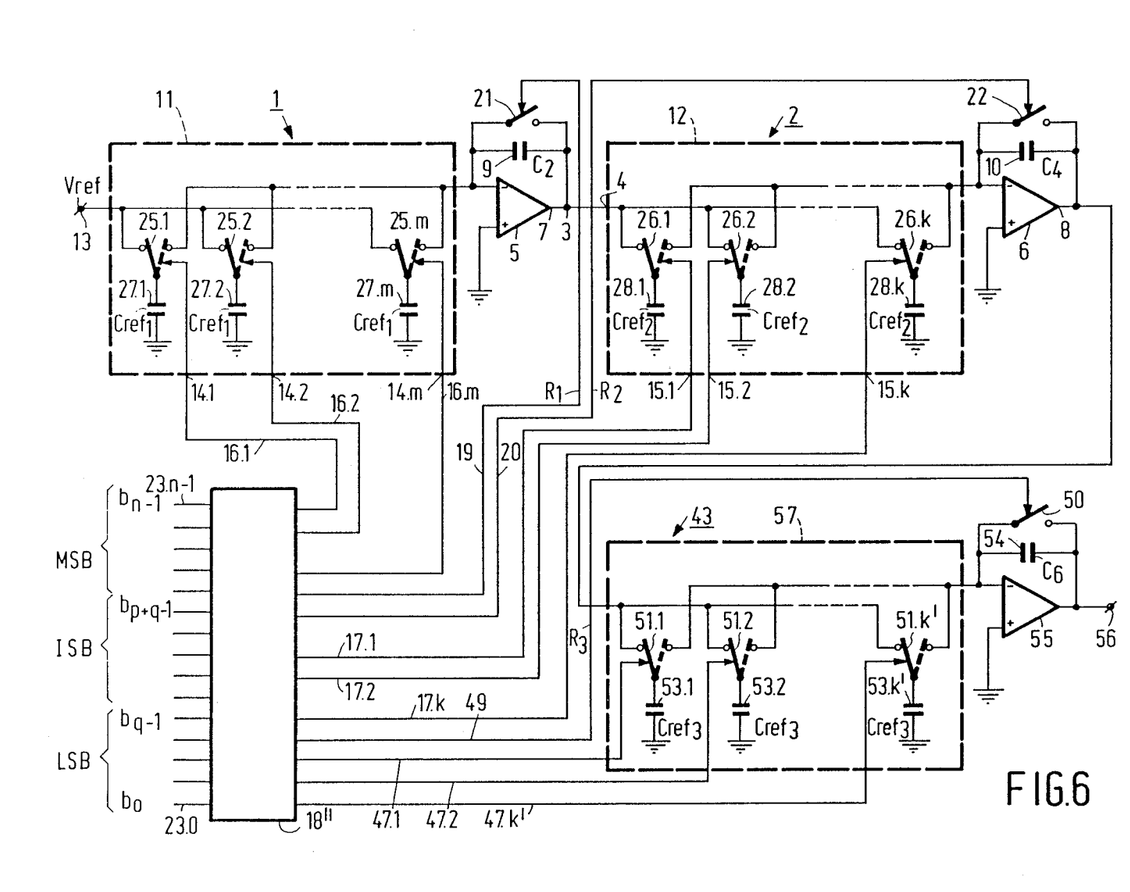
FIG. 6 shows an embodiment of a converter comprising three integrators.

FIG. 6 shows a three-stage converter for converting an n-bit digital signal. The integrators 1 and 2 of the converter are identical in structure to the integrators 1 and 2 of the converter of FIG. 1. The structure of integrator 43 is identical to that of the integrators 1 and 2. The capacitor network 57 comprises k' capacitors 53.1 to 53.k' arranged between ground and associated switches 51.1 to 51.k'. All capacitors 53 have the same capacitance Cref3. The switches 51 are switchable under the influence of signals which are generated by the control unit 18" and which are applied via the leads 47.1 to 47.k' to the switches. A reset signal R3 is applied via the lead 49 to the switch 50 which is arranged parallel to the capacitor 54 for discharging this capacitor.

The converter of FIG. 6 operates as follows. The first four integration steps of the converter of FIG. 6 correspond to the four integration steps of the converter of FIG. 1. As already described hereinbefore, the output 8 then conveys a voltage which is equal to $$(M1.k+M4).\alpha.\beta.Vref.$$

Subsequently a reset signal R1 is generated again. The voltage at the output 7 thus becomes equal to zero. Then a "high" signal, the fifth control signal, is generated on a number of the signal leads 16 in such a way that a total capacitance of M5.Cref1 is coupled for a short period to the inverting input of the amplifier stage 5. This means that the signal on the lead 16.1 becomes "high" (M5=1). A voltage which is equal to $$\alpha.Vref.$$

is then produced at the output 7. After the reset signal R3 has been applied to the switch 50, the capacitor 54 is discharged. Note that this discharge could also have taken place at an earlier moment. For example, it could have coincided in time with the discharge of the capacitors 9 and 10 at the start of the conversion. Subsequently the control unit 18" generates a sixth control signal across the leads 47.1 to 47.k' in such a way that a total capacitance of M6.Cref3 (=k'−M8).Cref3) is coupled to the inverting input of the amplifier stage 55. A voltage which is equal to $$(k'-M8).\delta.(M1.k+M4).\alpha.\beta.Vref,$$

is then produced at the output 56 of the amplifier stage 55, in which $\delta$ =Cref3/C6 is the capacitance of the capacitor 54. Here it holds that this last integration step could alternatively have been performed earlier, but after the fourth integration step. Subsequently, under the influence of a seventh control signal applied via the leads 17.1 to 17.k to the capacitor network 12, a number of switches 26 is switched for a short period to the position other than the one shown such that a total capacitance of M7.Cref2 is coupled to the inverting input of the amplifier stage 6. This means that, for example, the signal on the lead 17.1 becomes "high" (M7=1). A voltage which is equal to $$\alpha.\beta.Vref+(M1.k+M4).\alpha.\beta.Vref.$$

is then produced at the output 8. Subsequently, under the influence of an eighth control signal applied via the leads 47 to the capacitor network 57, a total capacitance of M8. Cref3 is coupled to the inverting input of the amplifier stage 55. The complementary part of the capacitors 53 in the network 57 is preferably coupled to the inverting input of the amplifier stage 55. A voltage which is equal to $$(k.k'.M1 + k'.M4 + M8).\alpha.\beta.\delta.Vref.$$

is then produced at the output 56.

For $k=2^p$ and $k'=2^q$ this reduces to $$(M1.2^{(p+q)} + M4.2^q + M8).\alpha.\beta.\delta.Vref,$$

in which $p+q \leq n$.

This means that the capacitor network 11 of FIG. 6 has m $(=2^{n-p-q})$ capacitors 25. For converting the n-bit digital signal $b_{n-1} \ldots b_0$, see FIG. 6, which is applied to the input 23 of the control unit 18" the (decimal) number LSB should thus be taken for M8, which number corresponds to the binary number $b_{q-1} \ldots b_0$ constituted by the q least significant bits in the n-bit digital signal. For M1 the (decimal) number MSB should be taken which number corresponds to the binary number $b_{n-1} \ldots b_{p+q}$ constituted by the $n-p-q$ most significant bits of the digital signal. For M4 the (decimal) number ISB should be taken, which number corresponds to the binary number $b_{p+q-1} \ldots b_q$ constituted by the remaining p bits.

If the offset $k.\beta.V_o$ present after the fourth integration step at the output 8 had been included in the calculation, this offset would have given rise to an offset of $(M8+k.k').\beta.\delta.V_o$ at the output 56 after the eighth integration step. Only the term $M8.\beta.\delta.V_o$ is dependent on the value of the n-bit digital signal. $\beta$ and $\delta$ are both generally smaller than 1 and are, for example, equal to $1/k'$ or $2^{-q}$ and $1/k$ or $2^{-p}$, respectively. Similarly, $\alpha$ is then equal to $2^{n+p+q}$. Thus, for the largest possible n-bit digital signal an amplitude is obtained in each stage which is equal to the input signal in the same stage. This means that the term $M8.\beta.\delta.V_o$ contributes to a small extent to the total offset at the output 56.

For n which is divisible by 3 and $p=q=n/3$ the total number of capacitors in the capacitor networks is smallest, namely $3.2^{n/3}$ and the required IC surface is smallest. Moreover, a three-stage converter, at a sufficiently large value for n, will require fewer capacitors than the two-stage converters of FIGS. 1 and 4, at an equal value of n for the two types of converters. However, the three-stage converter requires more clock pulses of the clock generator 24 than does the two-stage converter. Thus, the conversion in the three-stage converter takes slightly longer than the conversion in the two-stage converter.

It is of course evident that the control unit 18" in FIG. 6 may have a structure which is analogous to that of the control unit of FIG. 3. For designing a circuit for the control unit 18" it is thus necessary to use knowledge beyond that of those skilled in the art. In fact, the circuit is no more than the logical and obvious extension of the control unit for a two-stage converter to a control unit for a three-stage converter. A further explanation of the control unit 18" can therefore be dispensed with.

It is to be noted that the invention is not limited to the converters according to the embodiments shown. The invention can also be used for embodiments differing in features that do not relate to the invention. For example, it is possible to provide the three-stage converter of FIG. 6 with other capacitor networks, for example, capacitor networks in the form described with reference to FIG. 2 or 4. If the capacitor networks of FIG. 4 are used, it will be evident that the control will be different and hence the control unit will be formed differently. Such a control unit is then a logical extension of the control unit of FIG. 5 for use in a three-stage converter, and which requires no special knowledge to implement.

What is claimed is:

1. A digital-to-analog converter for converting a digital signal having a word length n into an analog signal, comprising
a series arrangement of a first and a second integrating circuit each having an input and an output and a control signal input, the output of the first integrating circuit being coupled to the input of the second integrating circuit, the first and second integrating circuits comprising a first and a second amplifier stage, respectively, having an inverting and a non-inverting input and an output and a first and a second capacitor, respectively, coupled between the inverting input and the output of the first and second amplifier stage, respectively, the first and the second integrating circuit each being adapted to perform an integration step under the influence of a control signal applied to its respective control signal input,
a control unit having a first and a second output coupled to the control signal input of the first and the second integrating circuit, respectively, said control unit being adapted to supply, in this order, a first control signal at its first output, a second control signal at its second output, a third control signal at its first output and a fourth control signal at its second output, characterized in that the integrating circuits are switched capacitor integrators in which a first capacitor network comprising at least two capacitors is coupled between the input of the first integrator and the inverting input of the first amplifier stage, a second capacitor network comprising at least two capacitors being coupled between the input of the second integrator and the inverting input of the second amplifier stage, the first capacitor network being adapted to coupled during a given time interval a total capacitance of M1.Cref1 and M3.Cref1 to the inverting input of the first amplifier stage under the influence of the first and the third control signal, respectively, the second capacitor network being adapted to couple during a given time interval a total capacitance of M2.Cref2 and M4.Cref2 to the inverting input of the second amplifier stage under the influence of the second and the fourth control signal, respectively, Cref1 and Cref2 being fixed capacitances, and in that for converting arbitrary digital signals having a word length n M2+M4 is equal to a constant (k).

2. A digital-to-analog converter as claimed in claim 1, further comprising a third integrating circuit which comprises a third switched capacitor integrator including a third amplifier stage, a third capacitor coupled between an inverting input and an output of the third amplifier stage and a third capacitor network comprising at least two capacitors coupled between an input of the third integrator and the inverting input of the amplifier stage, said third integrating circuit being arranged in series with the second switched capacitor integrator, said third integrator being adapted to perform an integration step under the influence of a control signal at a control signal input of said integrator, the control unit being adapted to generate a reset signal for bringing the signal at the output of the first integrator to an initial level and for subsequently generating a fifth control signal to be applied to a first output, the control unit being further adapted to generate, in this order, a sixth control signal and an eighth control signal to be applied to a third output which is coupled to the control signal input of the third integrator and being adapted to generate, after the sixth control signal and before the eighth control signal, a seventh control signal to be applied to the second output, the first capacitor network being further adapted to couple during a given time interval a total capacitance of M5.Cref1 to the inverting input of the first amplifier stage under the influence of the fifth control signal, the third capacitor network being adapted to couple during a given time interval a total capacitance of M6.Cref3 and M8.Cref3 to the inverting input of the third amplifier stage under the influence of the sixth and the eighth control signal, respectively, the second capacitor network being adapted to couple during a given time interval a total capacitance of M7.Cref2 to the inverting input of the second amplifier stage under the influence of the seventh control signal, Cref3 being a fixed capacitance.

3. A digital-to-analog converter as claimed in claim 2, wherein for converting arbitrary digital signals having a word length n, M6+M8 is equal to a constant (k').

4. A digital-to-analog converter as claimed in claim 3 for converting an n-bit digital signal, characterized in that the constant (k') is equal to $2^q$ in which $p+q \leq n$.

5. A digital-to-analog converter as claimed in claim 4, characterized in that M3=M5=M7=1, in that M8 is a value corresponding to the binary number constituted by the q least significant bits of the n-bit digital signal, M1 is a value corresponding to the binary number constituted by the n−p−q most significant bits and M4 is a value corresponding to the binary number constituted by the remaining p bits of the n-bit digital signal.

6. A digital-to-analog converter as claimed in claim 3, characterized in that the total capacitances M6.Cref3 and M8.Cref3 are constituted by parts in the third capacitor network which are complementary to one another.

7. A digital-to-analog converter as claimed in claim 2, characterized in that n is a number which is divisible by 3 and in that p=q=n/3.

8. A digital-to-analog converter as claimed in claim 4, further comprising a switching element connected in parallel with the first capacitor which is coupled between the inverting input and the output of the first integrating circuit, and wherein the switching element has a control signal input for receiving the reset signal.

9. A digital-to-analog converter as claimed in claim 1, characterized in that n is an even number and in that p=n/2.

10. A digital-to-analog converter as claimed in claim 1, wherein all capacitors in a capacitor network have a substantially equal capacitance.

11. A digital-to-analog converter as claimed in claim 1, characterized in that, by adding an index m (in which m is an integer) to the capacitors in a capacitor network, in which the index 1 is assigned to the capacitor having the lowest capacitance and subsequent indices are assigned to capacitors having a subsequent increasing capacitance, the capacitance ratio between the capacitor with index i and that with index i+1 is substantially equal to $\frac{1}{2}$ for each value of i, in which $1 \leq i \leq i_{m-1}$ and $i_m$ is the highest index value.

12. A digital-to-analog converter as claimed in claim 1, characterized in that the total capacitances M2.Cref2 and M4.Cref2 are constituted by parts in the second capacitor network which are complementary to one another.

13. A digital-to-analog converter as claimed in claim 1 for converting an n-bit digital signal, characterized in that the constant (k) is equal to $2^p$, in which $p \leq n$.

14. A digital-to-analog converter as claimed in claim 2, characterized in that M3=1, in that M4 is the value corresponding to the binary number formed by the p least significant bits of the n-bit digital signal and in that M1 is the value corresponding to the binary number formed by the n−p most significant bits of the n-bit digital signal.

15. A digital-to-analog converter as claimed in claim 2, further comprising a third integrating circuit which comprises a third switched capacitor integrator including a third amplifier stage, a third capacitor coupled between an inverting input and an output of the third amplifier stage and a third capacitor network comprising at least two capacitors coupled between an input of the third integrator and the inverting input of the third amplifier stage said third integrator being arranged in series with the second switched capacitor integrator, said third integrator being adapted to perform an integration step under the influence of a control signal at a control signal input of said third integrator, the control unit being adapted to generate a reset signal for bringing the signal at the output of the first integrator to an initial level and for subsequently generating a fifth control signal to be applied to a first output, the control unit being further adapted to generate, in this order, a sixth control signal and an eighth control signal to be applied to a third output which is coupled to the control signal input of the third integrator and being adapted to generate, after the sixth control signal and before the eighth control signal, a seventh control signal to be applied to the second output, the first capacitor network being further adapted to couple during a given time interval a total capacitance of M5.Cref1 to the inverting input of the first amplifier stage under the influence of the fifth control signal, the third capacitor network being adapted to couple during a given time interval a total capacitance of M6.Cref3 and M8.Cref3 to the inverting input of the third amplifier stage under the influence of the sixth and the eighth control signal, respectively, the second capacitor network being adapted to couple during a given time interval a total capacitance of M7.Cref2 to the inverting input of the second amplifier stage under the influence of the seventh control signal, Cref3 being a fixed capacitance.

16. A digital-to-analog converter as claimed in claim 15, wherein for converting arbitrary digital signals having a word length n, M6+M8 is equal to a constant (k').

17. A digital-to-analog converter as claimed in claim 16 for converting an n-bit digital signal, characterized in that the constant (k') is equal to $2^q$ in which $p+q \leq n$.

18. A digital-to-analog converter as claimed in claim 2, characterized in that n is an even number and in that p=n/2.

19. A digital-to-analog converter as claimed in claim 17, characterized in that n is a number which is divisible by 3 and in that p=q=n/3.

20. A digital-to-analog converter as claimed in claim 2, characterized in that, by adding an index m (in which m is an integer) to the capacitors in a capacitor network, in which the index 1 is assigned to the capacitor having the lowest capacitance and subsequent indices are assigned to capacitors having a subsequent increasing capacitance, the capacitance ratio between the capacitor with index i and that with index i+1 is substantially equal to ½ for each value of i, in which $1 \leq i \leq i_{m-1}$ and $i_m$ is the highest index value.

* * * * *

UNITED STATES PATENT AND TRADEMARK OFFICE
CERTIFICATE OF CORRECTION

PATENT NO. : 4,872,011

DATED : OCTOBER 3, 1989

INVENTOR(S) : MARCELLINUS J.M. PELGROM ET AL

It is certified that error appears in the above-identified patent and that said Letters Patent is hereby corrected as shown below:

IN THE ABSTRACT

Title page, line 13, change "this" to --each--;
        line 28, change "an" to --. An--.

IN THE CLAIMS

Claim 1, col. 12, line 46, change "coupled" to --couple--;
Claim 2, col. 12, line 68, insert --third-- after "the" and before "ampli-";
        col. 13, line 9, change "to be applied to a" to --at the--;
        col. 13, line 11, delete "to be applied";
        line 12, change "to" (first occurrence) to --at--;
        line 15, change "to be applied to" to --at--;
Claim 8, col. 13, line 52, change "4" to --2--;
        line 54, delete "which is coupled be-";
        line 55, delete "tween the inverting input and the output of the first";
        line 56, delete "integrating circuit. and";

UNITED STATES PATENT AND TRADEMARK OFFICE
CERTIFICATE OF CORRECTION

PATENT NO. : 4,872,011

DATED : October 3, 1989

INVENTOR(S) : Marcellinus J.M. Pelgrom, et al

It is certified that error appears in the above-identified patent and that said Letters Patent is hereby corrected as shown below:

```
Claim 14, col. 14, line 15, change "2" to --13--;
                  line 30, insert --,--(comma) after "stage" and
                  before "said";
                  line 38, change "to be applied to a" to --at
                  its--;
                  line 40, delete "to be applied";
                  line 41, change "to" (first occurrence) to
                      --at--;
                  line 44, change "to be applied to" to --at--;
Claim 18,    col. 14, line 67, change "2" to --13--;
Claim 20,    col. 15, line 5,  change "1" to --13--.
```

Signed and Sealed this

Eighteenth Day of December, 1990

*Attest:*

HARRY F. MANBECK, JR.

*Attesting Officer*  *Commissioner of Patents and Trademarks*